United States Patent
Murrin et al.

(10) Patent No.: US 9,194,902 B2
(45) Date of Patent: Nov. 24, 2015

(54) NOISE VARIANCE ESTIMATION AND INTERFERENCE DETECTION

(71) Applicant: Imagination Technologies Limited, Kings Langley (GB)

(72) Inventors: Paul Murrin, Chepstow (GB); Mohammed El-Hajjar, Southampton (GB)

(73) Assignee: Imagination Technologies Limited, Kings Langley (GB)

( * ) Notice: Subject to any disclaimer, the term of this patent is extended or adjusted under 35 U.S.C. 154(b) by 372 days.

(21) Appl. No.: 13/889,961

(22) Filed: May 8, 2013

(65) Prior Publication Data

US 2013/0322425 A1   Dec. 5, 2013

(30) Foreign Application Priority Data

May 30, 2012  (GB) .................................. 1209599.8

(51) Int. Cl.
| | |
|---|---|
| *H04B 7/06* | (2006.01) |
| *H04W 28/04* | (2009.01) |
| *G01R 29/26* | (2006.01) |
| *G01R 29/02* | (2006.01) |
| *H04L 1/20* | (2006.01) |
| *H04B 17/345* | (2015.01) |

(52) U.S. Cl.
CPC .............. *G01R 29/02* (2013.01); *H04B 17/345* (2013.01); *H04L 1/20* (2013.01); *H04L 1/206* (2013.01)

(58) Field of Classification Search
None
See application file for complete search history.

(56) References Cited

U.S. PATENT DOCUMENTS

| | | | |
|---|---|---|---|
| 2004/0218519 A1* | 11/2004 | Chiou et al. .................. | 370/203 |
| 2005/0278609 A1 | 12/2005 | Kim et al. | |
| 2006/0062322 A1 | 3/2006 | Namgoong et al. | |
| 2007/0291636 A1 | 12/2007 | Rajagopal et al. | |
| 2008/0031370 A1* | 2/2008 | Guey et al. ..................... | 375/260 |
| 2008/0181323 A1 | 7/2008 | Waters et al. | |
| 2009/0286497 A1* | 11/2009 | Akkarakaran et al. ..... | 455/226.3 |
| 2010/0124252 A1 | 5/2010 | Shin et al. | |
| 2013/0058443 A1* | 3/2013 | Carbonnelli et al. ......... | 375/350 |

FOREIGN PATENT DOCUMENTS

| | | |
|---|---|---|
| EP | 1689139 A | 8/2006 |
| EP | 2408117 A | 1/2012 |

OTHER PUBLICATIONS

GB1209599.8 Search Report dated Jan. 30, 2013.
GB1209599.8 Search Report of Sep. 27, 2012.

* cited by examiner

*Primary Examiner* — Andrew Chriss
*Assistant Examiner* — John Lequang
(74) *Attorney, Agent, or Firm* — Vorys, Sater, Seymour and Pease LLP; Vincent M DeLuca

(57) ABSTRACT

Noise variance estimation and interference detection is described. In one example, a method of estimating noise variance is described in which the pilots within a received OFDM signal are divided into bands and then a noise variance estimate is calculated on a per-band basis by averaging the noise estimates for those pilots within the band. In some examples, the pilots are divided into bands in frequency and in other examples, the pilots are divided into bands in frequency and time, such that noise estimates from more than one OFDM symbol are used in calculating the per-band noise variance estimates. The noise variance estimate for a pilot is then set to the noise variance estimate for the band which contains the pilot. The noise variance estimate for a data sub-carrier can then be determined by interpolating between the values for the pilots.

19 Claims, 11 Drawing Sheets

NOISE VARIANCE ESTIMATION AND INTERFERENCE DETECTION

CROSS REFERENCE TO RELATED APPLICATIONS

This application claims priority from United Kingdom Patent Application Ser. No. 1209599.8.8, entitled "NOISE VARIANCE ESTIMATION AND INTERFERENCE DETECTION", and filed on May 30, 2013, which is incorporated by reference in its entirety herein for all purposes.

BACKGROUND

FIG. 1 shows a schematic diagram of elements from a BICM (Bit Interleaved Coding and Modulation) module within a communications receiver. This receiver may, for example, be a Digital Terrestrial Television (DTT) receiver, such as a DVB-T2 receiver. The demapper 102 receives cells 104 and uses noise variance estimates 106 in order to output soft information 108 (which may also be referred to as soft estimates), such as Log-Likelihood Ratios (LLRs). This soft information 108 is passed to the decoder 110. In some examples, soft information is fed back to the demapper from the decoder (as indicated by dotted arrow 112).

Conventionally, the noise variance is estimated using the pilots within the broadcast signal. Each pilot cell is modulated with reference information that is known to the receiver and the locations of pilots are typically specified in the transmission standard. Assuming the pilots are represented as $x_s$ and the channel is represented as h, then the received symbol at a pilot bearing sub-carrier can be represented as:

$$y_s = h \cdot x_s + n_s.$$

This signal is passed through a noise-reduction filter, which is a low pass filter characterised by an "equivalent noise bandwidth" ENBW, which can simply be described as the percentage of the Nyquist bandwidth that the filter passband occupies. The filter is selected such that the channel component is not attenuated by the filter.

After applying the noise-reduction filter to the received signal $y_s$, the output of the filter can be represented as $\hat{y}_s = h \cdot x_s + n_{s2}$, where $\hat{y}_s$ represents the filtered signal and $n_{s2}$ represents the filtered noise samples. The channel estimate can be obtained as:

$$\hat{h} = \frac{\hat{y}_s}{x_s} = h + \frac{n_{s2}}{x_s}.$$

In order to estimate the noise samples outside the equivalent noise bandwidth of the filter, the following operation is done:

$$y_s = h \cdot x_s + n_s \Rightarrow n_s = y_s - h \cdot x_s \Rightarrow \hat{n} = y_s - \hat{h} \cdot x_s =$$
$$h \cdot x_s + n_s - \left(h + \frac{n_{s2}}{x_s}\right) \cdot x_s = h \cdot x_s + n_s - h \cdot x_s + n_{s2} \Rightarrow \hat{n} = n_s - n_{s2}$$

The above equation results in the complex noise estimate per pilot. The resultant noise is not the effective noise estimate. It has to be scaled by the effective noise bandwidth of the noise-reduction filter in order to get the effective noise per pilot. The noise variance per pilot is then evaluated as the power of the noise estimate per pilot and these per-pilot values are stored. Then the noise variance estimate is interpolated for the whole symbol.

The embodiments described below are not limited to implementations which solve any or all of the disadvantages of known methods of estimating noise variance for an OFDM (Orthogonal Frequency Division Multiplex) signal.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Noise variance estimation and interference detection is described. In one example, a method of estimating noise variance is described in which the pilots within a received OFDM signal are divided into bands and then a noise variance estimate is calculated on a per-band basis by averaging the noise estimates for those pilots within the band. In some examples, the pilots are divided into bands in frequency and in other examples, the pilots are divided into bands in frequency and time, such that noise estimates from more than one OFDM symbol are used in calculating the per-band noise variance estimates. The noise variance estimate for a pilot is then set to the noise variance estimate for the band which contains the pilot. The noise variance estimate for a data sub-carrier can then be determined by interpolating between the values for the pilots.

A first aspect provides a method of estimating noise variance within an OFDM receiver, the method comprising: evaluating a noise estimate for each of a plurality of pilots within one or more received OFDM symbols; dividing the plurality of pilots into bands; calculating a noise variance estimate for each band by averaging noise estimates for pilots within the band; storing the noise variance estimate for each band in memory; setting a noise variance estimate for a pilot equal to the calculated noise variance estimate for the band which includes the pilot; and determining a noise variance estimate for a data sub-carrier within the one or more received OFDM symbols by interpolating between the noise variance estimates for each pilot.

A second aspect provides a computer program comprising computer program code means adapted to perform all the steps of the method as described above when said program is run on a computer. The computer program may be embodied on a computer readable medium.

A third aspect provides a noise variance estimating element for an OFDM receiver, the noise variance estimating element comprising: estimating logic arranged to evaluate a noise estimate for each of a plurality of pilots within one or more received OFDM symbols; dividing logic arranged to divide the plurality of pilots into bands; calculating logic arranged to calculate a noise variance estimate for each band by averaging noise estimates for pilots within the band; memory arranged to store the noise variance estimate for each band in memory; and an interpolation engine arranged to set a noise variance estimate for a pilot equal to the calculated noise variance estimate for the band which includes the pilot and to determine a noise variance estimate for a data sub-carrier within the one or more received OFDM symbols by interpolating between the noise variance estimates for each pilot.

A fourth aspect provides an OFDM receiver comprising a noise variance estimating element as described above.

A fifth aspect provides a Digital Terrestrial Television receiver comprising a noise variance estimating element as described above.

A sixth aspect provides a method of detecting interference comprising: dividing a received OFDM symbol into one or more bands; dividing each band into a plurality of sub-bands; calculating the sub-band power for each sub-band, the sub-band power comprising the average power of all the sub-carriers within the sub-band; calculating a mean sub-band power within each band; for each band, determining if there is interference in a sub-band within the band, by comparing the sub-band power and the mean sub-band power within the band; on determining that there is interference in a sub-band within a band, increasing the noise variance estimate for sub-carriers within the sub-band; and decreasing the noise variance estimate for data sub-carriers in other sub-bands within the same band.

A seventh aspect provides a computer readable storage medium having encoded thereon computer readable program code for generating a processor comprising the noise variance estimating element described herein.

An eighth aspect provides a computer readable storage medium having encoded thereon computer readable program code for generating a processor configured to perform the method described herein.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

This acknowledges that firmware and software can be valuable, separately tradable commodities. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
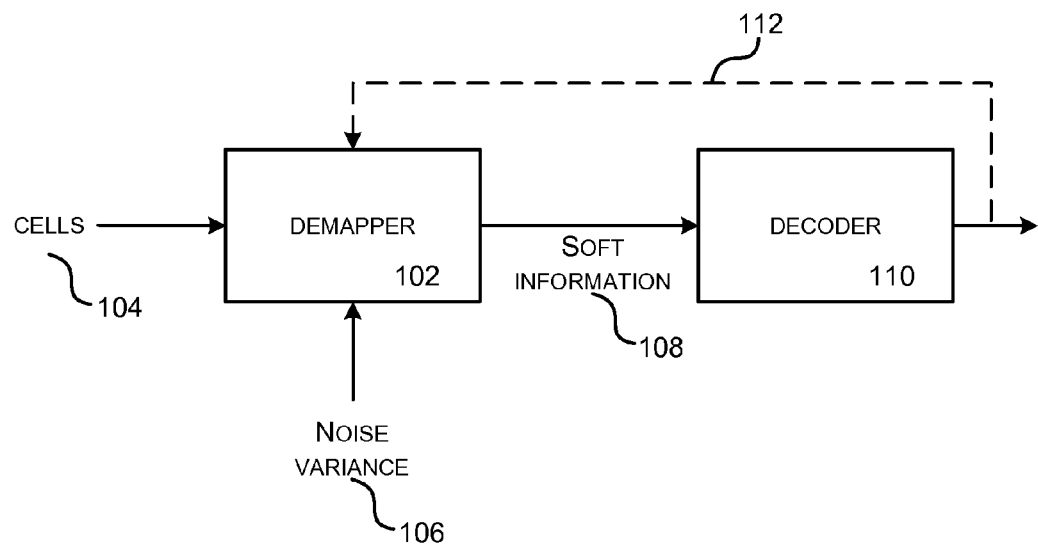
FIG. 1 is a schematic diagram showing elements from a Bit Interleaved Coding and Modulation module within a communications receiver.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 2:
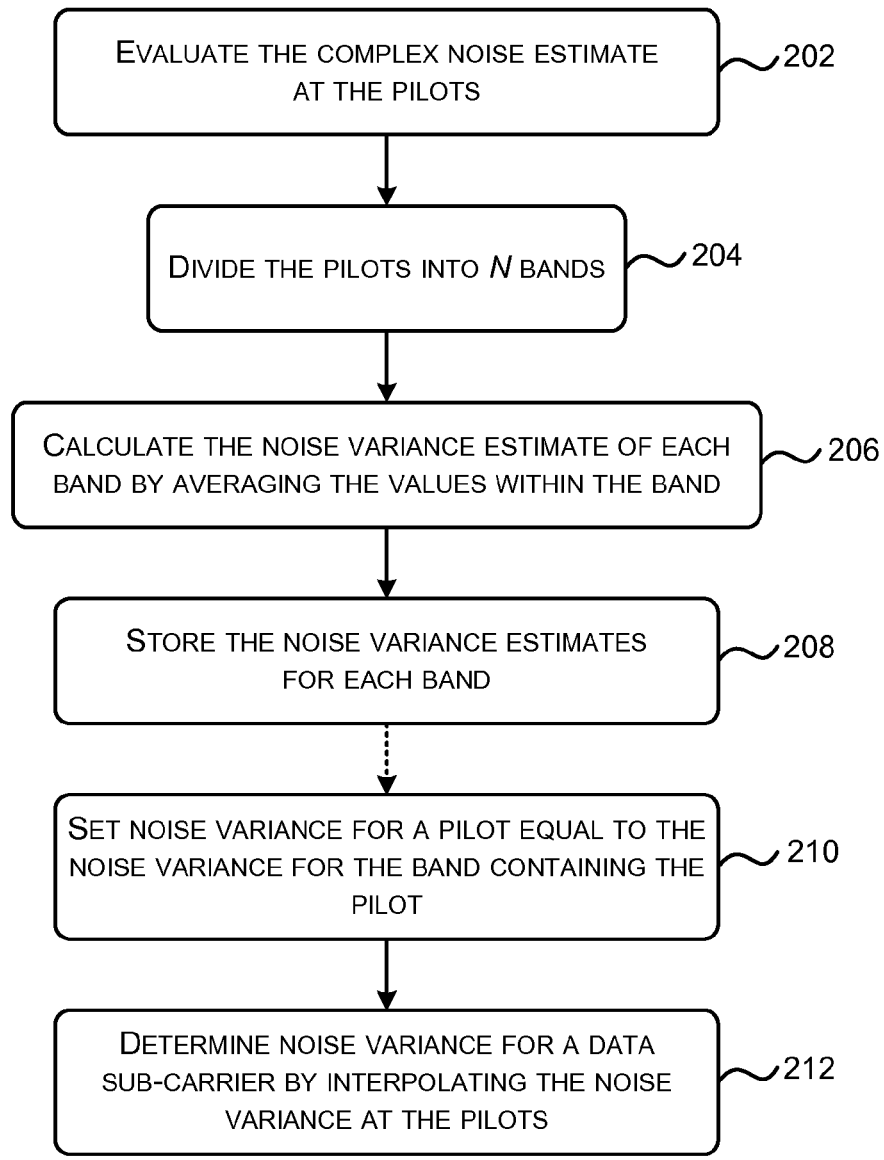
FIG. 2 is a flow diagram of an example of an improved method of estimating noise variance in an OFDM receiver.

FIG. 2 is a flow diagram of an example of an improved method of estimating noise variance in an OFDM receiver such as a DTT or DVB-T2 receiver. As described above, the noise variance estimates are used by the demapper within the receiver to generate soft information, such as LLRs, which are then used by the decoder. Where iterative decoding is used, soft information may also be passed back from the decoder to the demapper and used in subsequent iterations.

Figure 3:
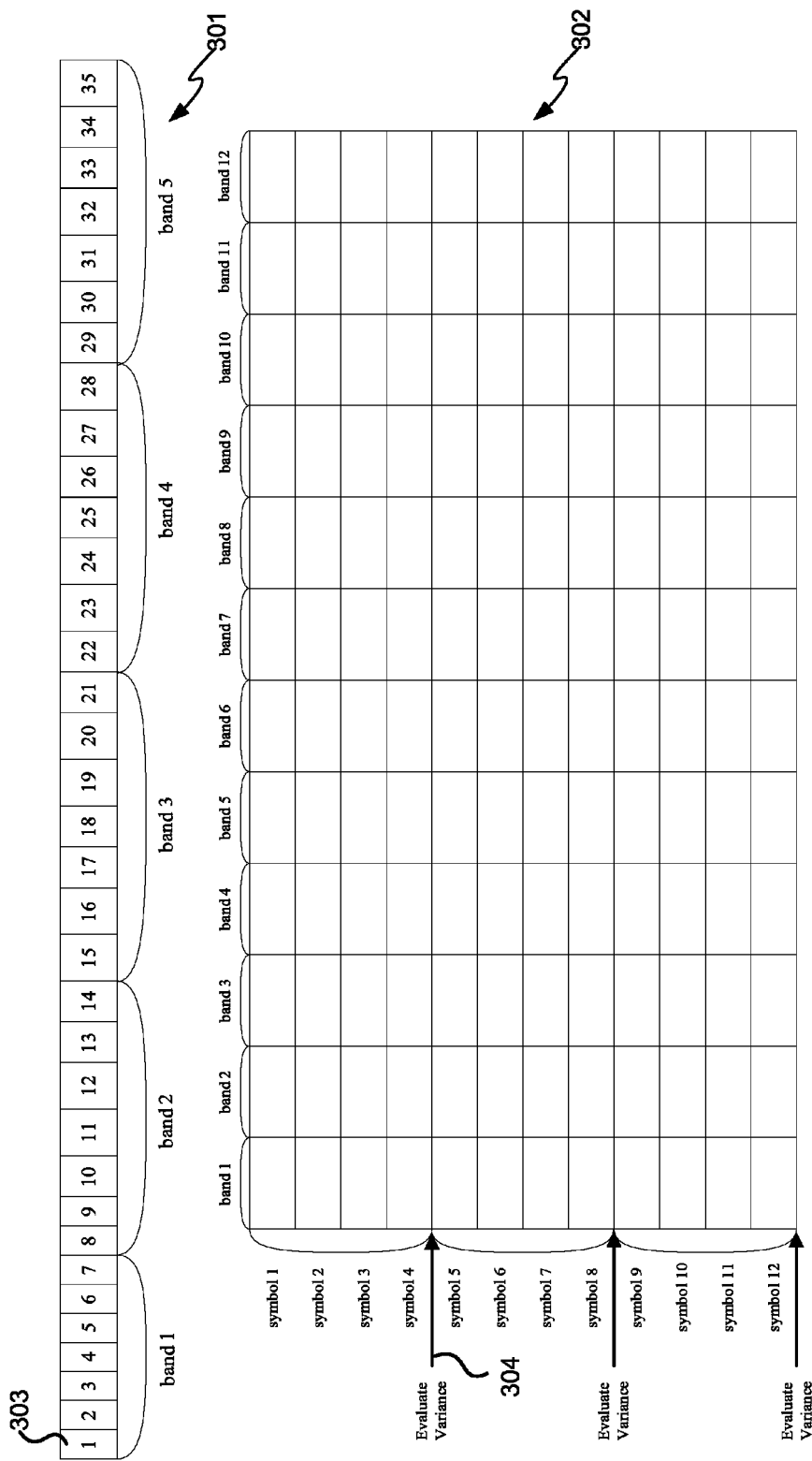
FIG. 3 shows schematic diagrams of how the pilots may be divided into two or more bands, for example as in the methods of FIGS. 2 and 4.

The complex noise estimate at each pilot within a received OFDM symbol is evaluated (block 202), for example, as described above ($\hat{n}$). The pilots are divided into two or more bands, i.e. into N bands, where N is an integer and N>1 (block 204) and the noise variance of each band is evaluated using an averaging algorithm (block 206). In an example, an online algorithm called Welford's method may be used and this algorithm is described in the following two web pages: http://www.johndcook.com/standard_deviation.html and http://en.wikipedia.org/wiki/Algorithms_for_calculating_variance#On-line_algorithm. As shown in FIG. 3 and described below, the division of pilots into bands (in block 204) may be in frequency alone or in both frequency and time and the averaging algorithm used (in block 206) may be in time and/or frequency (use of averaging over both time and frequency is described in more detail below). The resultant noise variance values for each band are then stored (block 208) and the method may be repeated for each symbol.

As described above, N>1 and in some examples the value of N will have an upper limit, for example such that $1 < N \leq 40$. A single band (N=1) is not used because it does not provide a sufficiently accurate estimate of noise variance, particularly where filters are sloped which has the effect that the Signal to Noise Ratio (SNR) changes across the band. The value of N which is used may be selected such that a band encloses sufficient pilots to provide a variance estimate which is not too noisy whilst maintaining sensitivity to variation in variance in both the frequency and time axes. The value of N that is used may vary for different OFDM symbol sizes and pilot densities.

The flow diagram of FIG. 2 also shows how the computed noise variance estimates per-band are subsequently used. The noise variance for a pilot is set equal to the noise variance value for the band in which the pilot is located (block 210). The noise variance for a data sub-carrier can then be estimated by interpolating the noise variance at the pilots (block 212).

FIG. 3 shows two schematic diagrams 301, 302 of how the pilots may be divided into two or more bands. In the first example, 301, where each rectangle 303 containing a number represents a pilot, the 35 pilots are divided into 5 bands (N=5) by frequency only. In this example, each band contains the same number of pilots; however, in other examples, the bands may contain a different number of pilots (e.g. where the number of pilots is not divisible by N, one band may contain a different number of pilots). As described above with reference to FIG. 2, the noise variance estimate in band 1 is the average of the noise estimate values for each of pilots 1-7 (as calculated in block 208) and then the noise variance of each of pilots 1-7 is set (in block 210) to be equal to the noise variance in band 1. Similarly, the noise variance on pilot 20 is the noise variance in band 3 and the noise variance on pilot 32 is the noise variance in band 5.

The use of averaging over multiple pilots (or multiple pilots over multiple symbols as described below), as shown in FIG. 2, provides a more accurate estimate of the noise variance than estimating the noise power per pilot. In this method only the noise variance estimates per band are stored (in block 208) and the noise variance estimates per sub-carrier do not need to be stored. This means that less memory is needed to store the noise variance estimates In some examples, such as in certain OFDM symbol sizes and pilot patterns modes, the number of pilots per symbol is not very large and may not be sufficient to get an accurate estimate of the noise variance. In such examples the bands may be defined in both frequency and time as shown in the second example 302 in FIG. 3. Bands which are defined in both frequency and time may also be used in other situations (e.g. where narrower frequency bands are used and the time extent of the bands is increased to maintain frequency selectivity, at the expense of time selectivity). In the example shown in FIG. 3, there are 12 bands (N=12) and each band spans one or more pilots (in frequency space) and four symbols (in time).

In examples where bands are defined in both frequency and time, the improved method of estimating noise variance in an OFDM receiver shown in FIG. 2 may also be used. In order to calculate the noise variance of each band by averaging the values within the band (in block 206), the noise estimate per pilot (as determined in block 202) may be saved in memory for each pilot in M OFDM symbols (e.g. M=4) and then the noise estimates of the pilots collected in time and frequency for each band may be averaged; however, this requires significant storage. The positions in time where the noise variance is evaluated (in block 206) are indicated by arrows 304 in FIG. 3.

Figure 4:
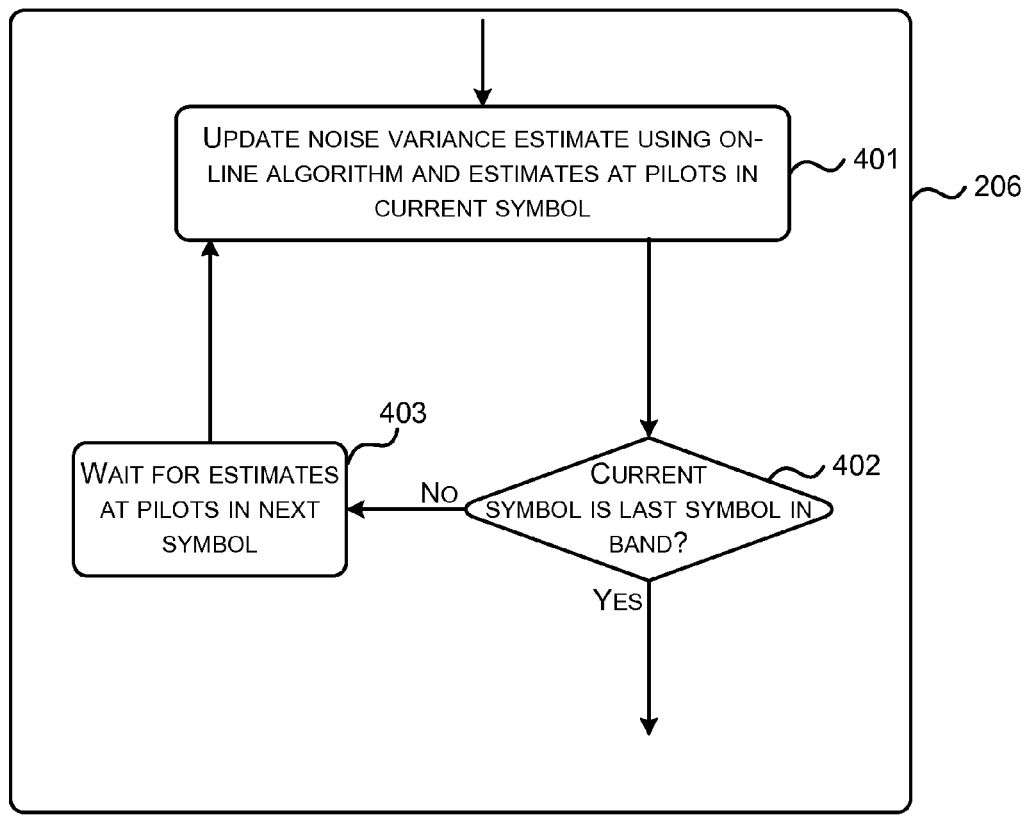
FIG. 4 is a flow diagram showing an example implementation of one of the blocks from the method of FIG. 2.

To reduce storage requirements, an on-line variance estimation algorithm (such as Welford's method, described above) may be used to calculate the noise variance estimate of each band (in block 206). As shown in FIG. 4, the calculation of noise variance (in block 206) comprises updating the variance estimate for each band (block 401) using the noise estimates for all of the pilots of the symbol being processed which lie within the band (as evaluated in block 202) and then further updating the variance estimate (which may be referred to as a running variance estimate) as each symbol within a band is processed. As shown in FIG. 4, if this is not the last symbol in the band ('No' in block 402), the method waits to receive the values from the next symbol (block 403) before repeating the updating of the variance estimate (in block 401). By using such an on-line algorithm only the running sums (which may also be referred to as running parameters) of the on-line algorithm for each band need to be stored (e.g. 3 values for each band where Welford's method is used) instead of noise estimates for each pilot in M OFDM symbols.

Figure 5:
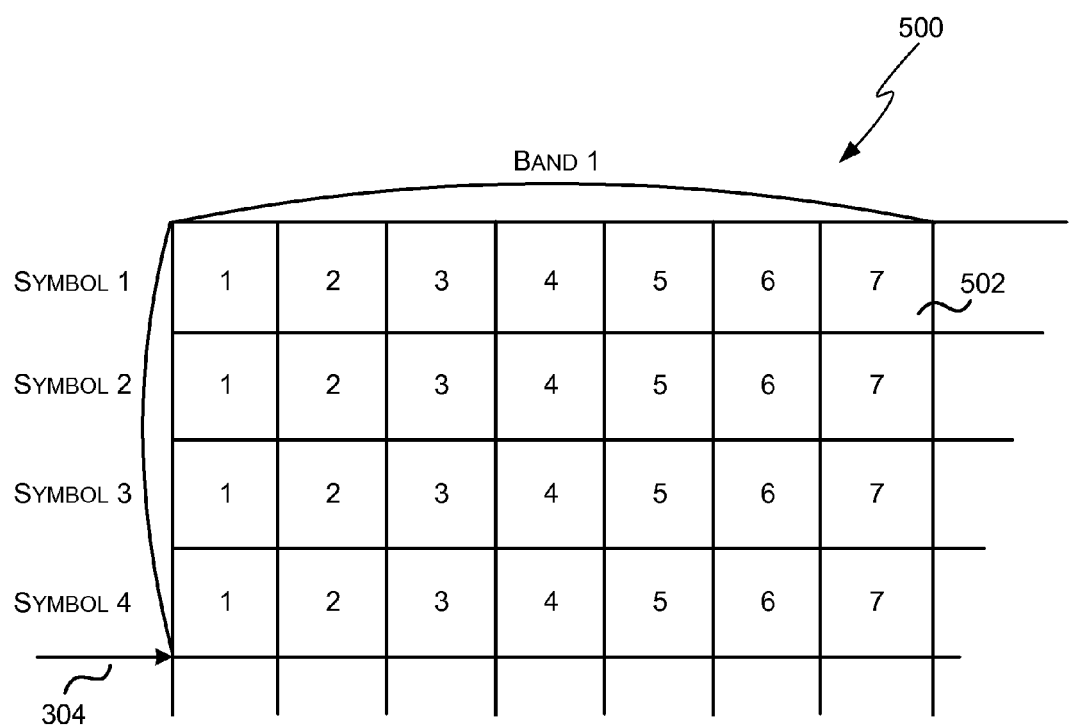
FIG. 5 is a schematic diagram showing an enlarged portion of the second diagram in FIG. 3.

In the example 302 shown in FIG. 3, the pilots in symbol 1 and symbol 2 that are in band 1 will contribute to the noise variance of band 1 and this can be more clearly seen in FIG. 5 which shows an enlarged view 500 of band 1 from the second example 302 in FIG. 3. In this example, each band comprises seven pilots in frequency (the pilots are shown as rectangles 502 containing numbers) and as in the first example 301 in FIG. 3, the data sub-carriers are ignored when dividing the pilots into bands. As described above, the noise variance estimates per-band are then stored (in block 208).

Although FIG. 5 shows each band comprising seven pilots in frequency and four symbols in time (M=4) such that the noise variance is estimated based on values collected from the seven pilots over the four symbols (i.e. based on 28 noise estimates, although as described above with reference to FIG. 4, the estimate may be generated in an iterative process which does not require storage of all 28 noise estimates), it will be appreciated that this is shown by way of example and in other examples different combinations of number of pilots per band and values of M may be used. In selecting the values of M and N which define the size of the bands, there are a number of parameters which may be traded off against each other: the accuracy of the noise variance estimate (which is dictated by the number of pilots used in the estimate and so is affected by both M and N), the frequency resolution of the noise variance estimate (which is affected by N) and the time resolution of the noise variance estimate (which is affected by M). In an example, the value of M (i.e. the number of symbols in the time domain for which noise estimates are collected before estimating the noise variance) may be selected to keep the number of samples per band equivalent in all configurations, where this is possible given the constraints of the pilot pattern. For example, in the 8K OFDM symbol the following parameters may be selected: M=2 symbols and 8 pilots per band in the frequency space. This means that a band has 16 pilots. In a 2K OFDM symbol case, the following parameters may be considered: M=8 and 2 pilots per band in the frequency space. This means that there are 16 pilots in a band as in the 8K case. This is an example only and it is not always possible to have the same number of pilots in a band in all configurations (e.g. there may be 16 pilots per band in 8K mode while there are only 15 pilots in a 4K mode).

It will be appreciated that FIG. 4 is a flow diagram of an example implementation of one block of the method shown in FIG. 2. Although in the examples shown in FIGS. 3 and 5, M=4, M may take different values. It will further be appreciated that although the method of FIG. 4 with M>1 may be used where the number of pilots per symbol is not sufficient to get an accurate estimate of the noise variance, this method may be used in situations where there are sufficient pilots per symbol in order to increase the accuracy of the noise variance estimate or to increase the frequency resolution. To increase the accuracy of the noise variance estimate, the size of a band may be increased in time (by increasing the value of M) and/or frequency (by increasing the number of pilots per band). Where a channel varies in time, increasing the number of pilots per band may lead to more accurate results than increasing the averaging over time (i.e. by increasing the value of M).

The averaging algorithm which is used to calculate the noise variance estimate (in block 206) may only use those values evaluated for a single symbol (in block 202 of FIG. 2) or may use those values for M symbols (where M>1, e.g. using an on-line algorithm as shown in FIG. 4). In many examples, however, time-averaging may also be employed (e.g. as part of the averaging algorithm) such that a noise estimate is evaluated based on the newly calculated noise variance estimate (from block 206) and the previous noise variance estimate (e.g. as stored in block 208 of a previous iteration of the method shown in FIG. 2). In an example, a simple recursive average may be used (single pole low pass filter); $Y_n = Y_{n-1}(1-\alpha) + \alpha X_n$. Such an average has minimal storage requirements. In such examples, a configuration-specific time average constant may be used. Time-averaging may be used to further improve the variance estimate at the cost of slower response to variation in time. Where the initial variance estimate is calculated over a time-frequency band (where M>1, e.g. as shown in example 302 in FIG. 3) is that an initial estimate of the variance can be obtained rapidly even if a fairly slow time constant is subsequently used for further time averaging.

These methods, as shown in FIGS. 2 and 4 and described above, provide an estimate of noise variance quickly whilst still providing an accurate estimate. Without an accurate estimate, the demapping which is performed by the demapper (e.g. demapper 102 in FIG. 1) will be less accurate. The methods described above also use significantly less memory than conventional methods. In conventional methods of noise variance estimation where good frequency resolution is required, a noise variance estimate is stored for each pilot; however, as shown in FIG. 2, using the methods described herein, values are only stored for each band (in block 208). In many implementations of the methods described herein N≤40 and so the number of stored values (the noise variance estimates for each band) is significantly lower than the number of stored pilots and hence is significantly lower than the number of stored values in a conventional method of noise estimation. The methods described herein also converge faster to the correct noise variance than time averaging the noise estimates for each pilot separately.

It will be appreciated that the method steps of FIG. 2 may be performed, in some instances, in a different order or steps may be performed at the same time. For example, FIG. 2 shows that the pilots are divided into bands (in block 204) after the complex noise estimate has been evaluated for each pilot (in block 202); however in another example, the steps may occur in the opposite order (e.g. block 204 followed by block 202). It will be appreciated that the steps may be performed independently either in any order or at the same time such that the noise estimates per pilot and information about the bands are available in order that the averaging of values for a band can then be performed (in block 206). It will further be appreciated that the way that the pilots are divided into bands (in block 204) may be fixed or pre-defined such that this method step does not need to be performed each time the method is performed (e.g. this step may be performed once and then the information about which pilots are in which bands may be stored and accessed as required). In other examples, the division of pilots into bands may be performed dynamically each time the method is performed or an initial division of pilots into bands may be adjusted dynamically to adapt to different conditions (e.g. where there are highly time variant and/or frequency variant conditions).

Figure 6:
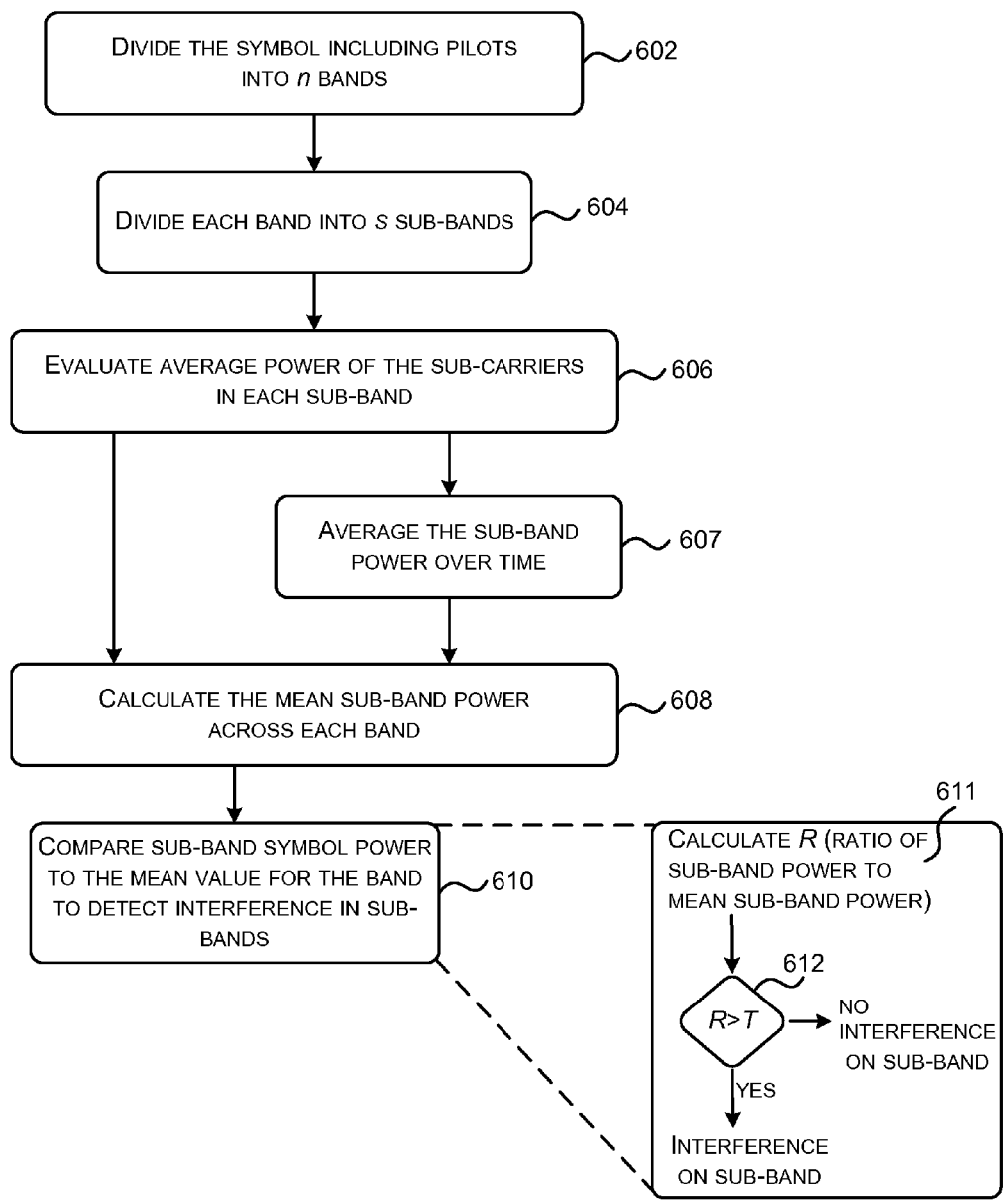
FIG. 6 is a flow diagram of an example method of interference detection which may be used in combination with the methods shown in FIGS. 2 and 4 or which may be used independently.
Figure 7:
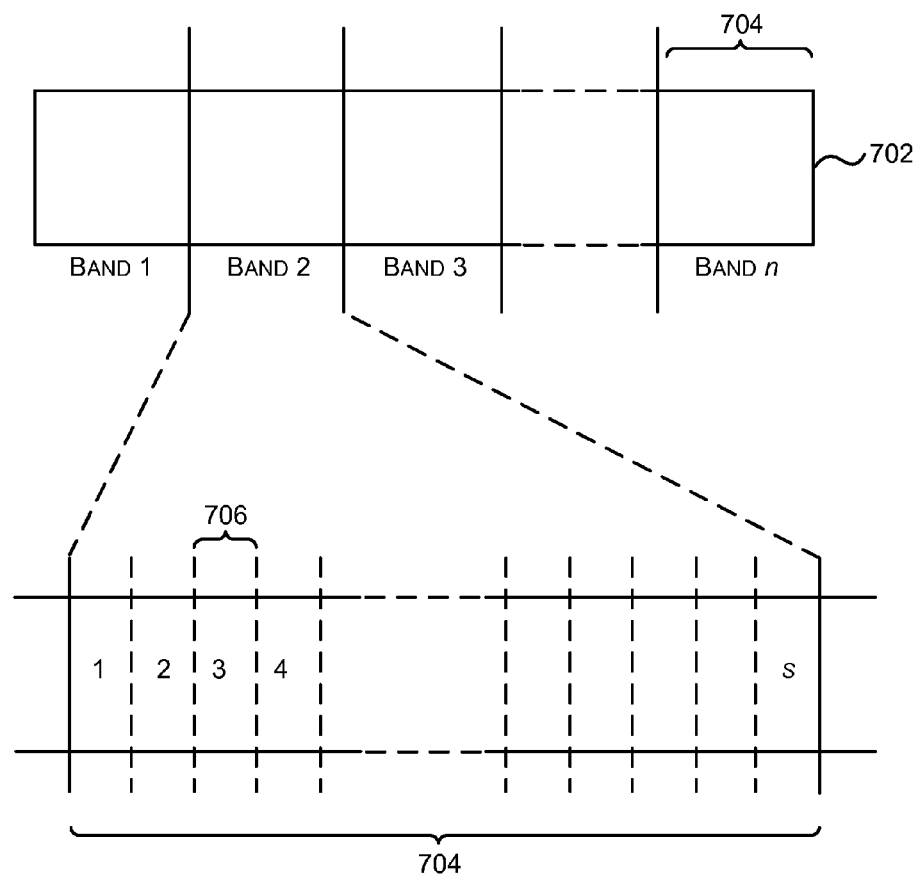
FIG. 7 is a schematic diagram showing a received OFDM symbol divided into bands and sub-bands.
Figure 9:
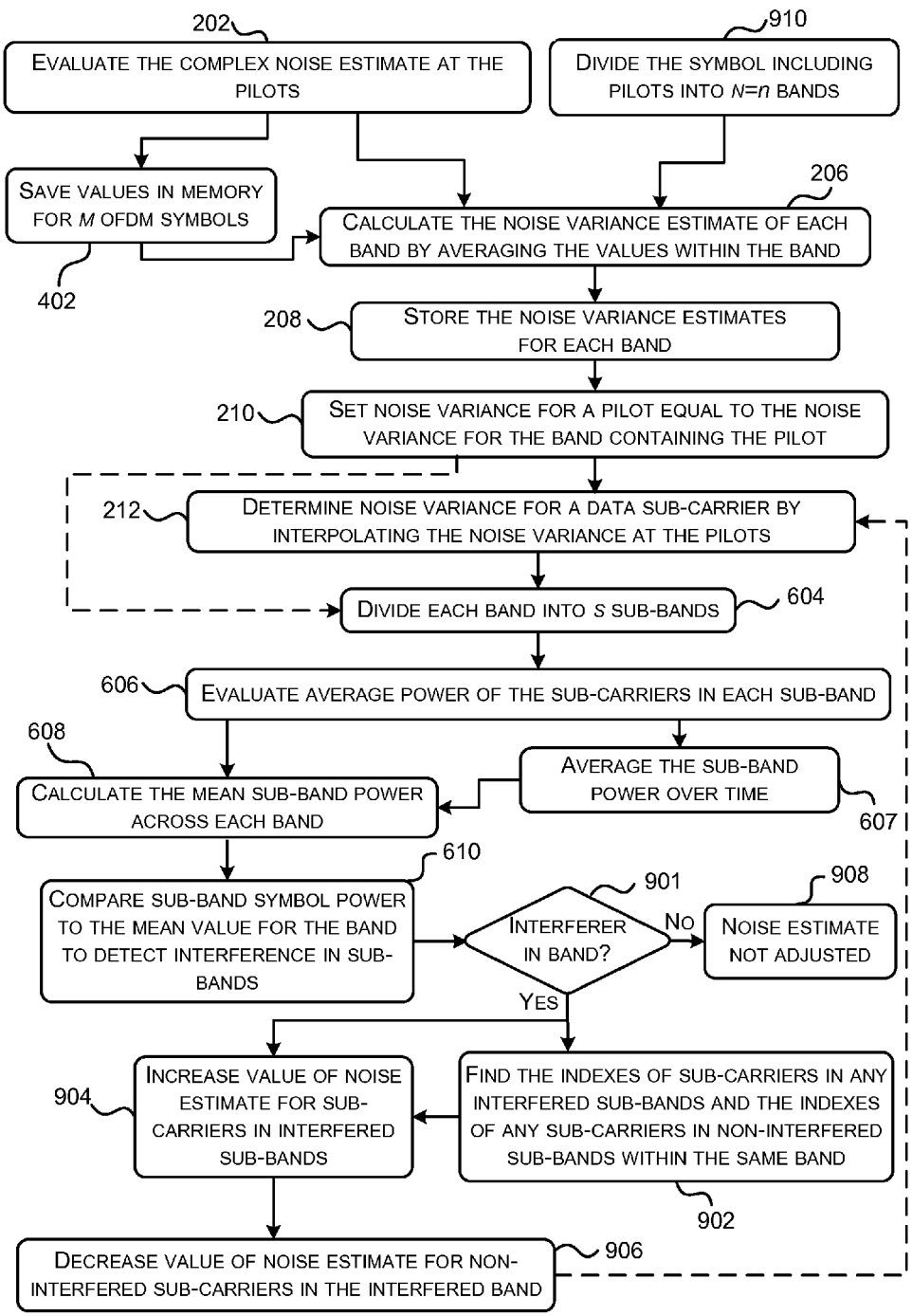
FIG. 9 is a flow diagram of an example method of interference detection and mitigation.

FIG. 6 is a flow diagram of an example method of interference detection which may be used in combination with the methods described above or may be used independently. This method may be described with reference to FIG. 7 which shows a schematic diagram of a symbol 702 divided into bands 704 and sub-bands 706. In this method of interference detection, the symbol 702, including both the pilots and the data sub-carriers, is divided into n bands (block 602) and each band is sub-divided into s sub-bands (block 604). This is different from the division into bands described above with reference to FIG. 2 because it includes the data sub-carriers and the division described with reference to FIG. 2 only considered the pilots; however, where the two methods are used together (e.g. as shown in FIG. 9 and described below), the edges of the bands used in the two methods are aligned exactly. The division into bands and sub-bands (in blocks 602 and 604) is performed in frequency (e.g. such that carriers which are adjacent frequency are either in the same sub-band or in an adjacent sub-band).

In an example implementation, the symbol is divided into 40 bands (n=40) and each band is divided into 20 sub-bands (s=20); however, these are provided by way of example only and other values of n and s may be used. In the example shown, all the bands are of equal size in terms of the number of sub-carriers they contain and similarly, all the sub-bands are of equal size in terms of the number of sub-carriers they contain; however, in other examples, the bands and/or sub-bands may contain a different number of sub-carriers (e.g. where the number of sub-carriers is not divisible by n, one band, such as the last band, may contain a different number of sub-carriers).

Having divided the symbol into bands (in block 602) and the bands into sub-bands (in block 604), the average power of the sub-carriers in each sub-band is evaluated (block 606). These values, which may be referred to as the sub-band power or sub-band symbol power, are then used to calculate the mean sub-band power across each band (block 608). Referring to the example shown in FIG. 7, the average power of each sub-band 1-s in each band 1-n is determined (in block 606) and then these average powers for each sub-band are themselves combined (in block 608) to calculate the mean sub-band power for each band 1-n, i.e.:

$$P_{av}^y = \frac{P_1^y + P_2^y + \ldots + P_s^y}{s}$$

where y is the band index which identifies the band and takes a value between 1 and n.

Unlike the second example 302 shown in FIGS. 3 and 5 (and described above), in this method of interference detection, a single symbol is considered and there is no aggregating of data from different symbols when forming the bands and sub-bands. In some implementations however, for example where there is only a small number of sub-carriers in each sub-band, an additional step may be performed which averages the sub-band power over time (in block 607) before the mean sub-band power across the band is computed (in block 608). Performing this optional averaging step eliminates any instantaneous power variation which is due to the data itself, rather than any interferer; however, this step is not required in situations where there are sufficient sub-carriers within each sub-band and the method operates more quickly if this optional averaging step is omitted. The number of sub-carriers which may be considered 'sufficient within a sub-band may be dependent upon the type of data (e.g. a high order modulation has much more amplitude variation than something like QPSK so would require more data to average these variations out).

The presence of interference is then detected within a sub-band (in block 610) by comparing, for a particular sub-band, the sub-band power $P_x^y$, where x is the sub-band index within band y, such that x takes a value between 1 and s, (as computed in block 606 or in block 607 where time averaging is used) and the mean sub-band power across the band in which the sub-band is located, $P_{av}^y$. In example, interference may be detected where, for a given sub-band, the sub-band power is considerably higher than the mean sub-band power across the band (e.g. $P_x^y \gg P_{av}^y$). FIG. 6 also shows a specific example implementation of this comparison step which uses a threshold value, T. As shown in FIG. 6, the ratio, R or $R_x^y$, of the sub-band power (for sub-band x in band y) to the mean sub-band power (across band y) is calculated (block 611):

$$R_x^y = \frac{P_x^y}{P_{av}^y}$$

If the value of this ratio exceeds the threshold ('Yes' in block 612) it is inferred that interference is present and if the value of this ratio does not exceed the threshold ('No' in block 612) it is inferred that interference is not present within the particular sub-band. In other examples, interference may be inferred if R≥T (instead of R>T as shown in FIG. 6). As described in more detail below, the threshold T may be the same for all bands or may be band-specific, in which case it may be written $T^y$.

In an example, the value of the threshold T (which may be referred to as the power ratio threshold) may be calculated based on the ratios, R or $R_x^y$, calculated for each sub-band x within a band y. In an example:

$R_{mean}^y$=mean value of R across band y $R_{min}^y$=minimum value of R across band y $T^y=1.2(2R_{mean}^y-R_{min}^y)$ It will be appreciated that this provides just one example of the way that the value of the threshold T may be calculated. In other examples, the value of the threshold may be calculated using ratios (such as those described above) calculated across an entire symbol, or using any other method.

Figure 8:
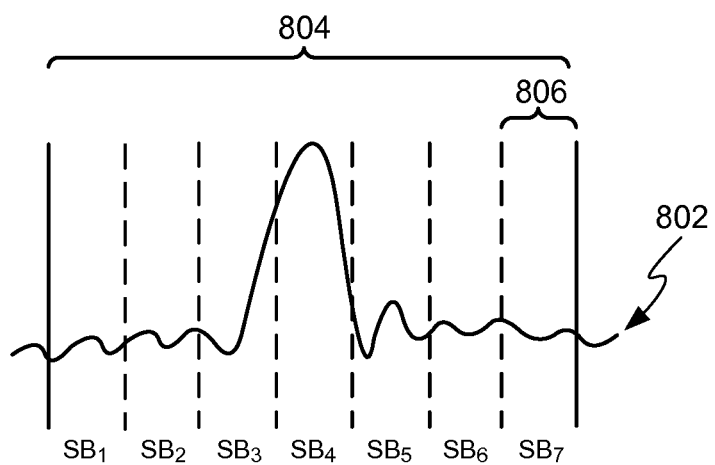
FIG. 8 shows a simple graphical representation of the received power of a received signal across a band.

FIG. 8 shows a simple graphical representation of the received power 802 of a received signal across a band 804. As described above, the band is divided into s sub-bands 806, where in this example s=7 and each sub-band is denoted $SB_x$ where x=1-7. It can be seen that there is an interferer in $SB_3$ and $SB_4$. Using the methods described above with reference to FIGS. 6 and 7, the sub-band power is evaluated for each sub-band (in block 606) and then the mean sub-band power across the band is evaluated (in block 608). In performing the comparison (in block 610) it can be seen that the sub-band power in sub-band $SB_4$ will be significantly higher than the mean value across the band and the sub-band powers in sub-bands $SB_3$ and $SB_5$ will also be elevated. Depending on the value of the threshold used (where a threshold is used to make the determination as to whether an interferer is present or not), an interferer will be identified in $SB_4$ and may be identified in $SB_3$. The elevation of the sub-band power in $SB_5$ is unlikely to be large enough to exceed any threshold test.

Using the interference detection methods described above with reference to FIGS. 6-8, the index of the sub-carriers (whether pilot or data sub-carriers) which are in an interfered sub-band (e.g. those sub-carriers in $SB_4$) can be identified and those neighbouring non-interfered sub-carriers, i.e. those sub-carriers which are in a neighbouring sub-band where interference is not detected (e.g. those sub-carriers in $SB_1$-$SB_3$ and $SB_5$-$SB_7$) can also be identified. The term 'neighbouring' is used herein to refer to sub-carriers which are in the same band, but not the same sub-band and includes sub-carriers which are not immediately adjacent and sub-carriers which are not in an immediately adjacent sub-band. Through the use of both pilot sub-carriers and data sub-carriers in these methods, interferers can be identified even where the interferers do not coincide with a pilot.

Although the above description of FIG. 6 refers to a symbol being divided into bands (in block 602) and then each band being divided into sub-bands (in block 604), it will be appreciated that this is just one way of implementing the method such that the same end result is achieved: a symbol divided into bands, with each band comprising a plurality of sub-bands. In another example, the symbol may be first divided into sub-bands and then adjacent sub-bands may be grouped together to form bands. Similarly in discussions of FIG. 2, the pilots are described as being divided into bands (in block 204) and this may alternatively be viewed as grouping the pilots into bands. These comments are also applicable to FIG. 9 (described below) which includes method steps from FIGS. 2 and 6.

In a further variation on the interference detection methods described above and shown in FIG. 6, the mean power may be calculated across the whole symbol (in block 608) instead of calculating it on a per-band basis. In such an implementation, $R_{mean}$ would be the mean value of R across the entire symbol and $R_{min}$ would be the minimum value of R across the entire symbol. In such an example, the threshold T would be the same for all bands (e.g. with $T=1.2 \times (2R_{mean}-R_{min})$) and the comparison performed (in block 610 and 612) would be between $R_x^y$ and T. In this variation, there are still multiple bands each divided into sub-bands and so the ratio of sub-band power to band power ($R_x^y$) is calculated locally with respect to frequency to provide some immunity to frequency selective channels, however a single threshold T is used for all bands.

As described above, the interference detection methods may be used independently of the methods of estimating noise variance described above. Alternatively, the methods may be used together such that interference detection and mitigation may be performed and an example method is shown in FIG. 9 (which combines the steps of the methods shown in FIGS. 2 and 6 as described above). Using this method, the noise variance estimates which are calculated for a pilot (e.g. in block 210) or a data sub-carrier (e.g. in block 212) can then be adjusted (in blocks 904 and 906), based on the detection of interfered and non-interfered sub-carriers (in block 610), to increase or decrease the noise variance estimates. As described below, some noise variance estimates will be left unchanged, i.e. values for those sub-carriers (whether pilot or data sub-carrier) in bands where there is no interferer ('No' in block 901 followed by block 908). Where a sub-carrier is identified as being in an interfered sub-band (e.g. in block 902), the value of the noise estimate is increased (in block 904) and where a sub-carrier is identified as being in a non-interfered sub-band within a band which contains an interferer, the value of the noise estimate is decreased (in block 906).

Where it is the noise variance estimates calculated for each pilot (in block 210) that are adjusted (in blocks 904 and 906), the interpolation (in block 212) may be performed after the adjustment (as indicated by the dotted arrow from block 906 to block 212). The identification of interference (in block 610) and the adjustment itself (in blocks 904 and 906) may be performed in the same way irrespective of whether the sub-carrier is a pilot or a data sub-carrier and so the following description refers to sub-carriers in general.

In order to identify which sub-carriers should have their noise estimate values adjusted (in block 904 or 906), the method may identify (in block 902) two sets of sub-carriers, where sub-carriers within each set may be identified by their index. The first set comprises any sub-carriers in an interfered sub-band (as identified in block 610) and the second set comprises any neighbouring non-interfered sub-carriers in the same band as an interfered sub-band. As described above, neighbouring sub-carriers are those sub-carriers which are in the same band, but not necessarily the same sub-band. The second set of sub-carriers may alternatively be described as comprising those sub-carriers which are in the same band as a sub-carrier in the first set, but which are not members of the first set. Sub-carriers in the first set will have their noise variance estimates increased (in block 904) and sub-carriers in the second set will have their noise variance estimates decreased (in block 906).

It can be seen from FIG. 9 that the symbol is divided into n=N bands (in block 910). Where the methods of FIGS. 2 and 6 are combined, the same bands are used for both noise variance estimation and interference detection so that the mapping of the output of the two algorithms is straightforward and the bands may be created by dividing the symbol including the pilots into bands (e.g. as described above with reference to block 602 in FIG. 6). Although different bands may alternatively be used, this results in significantly increased complexity.

Figure 10:
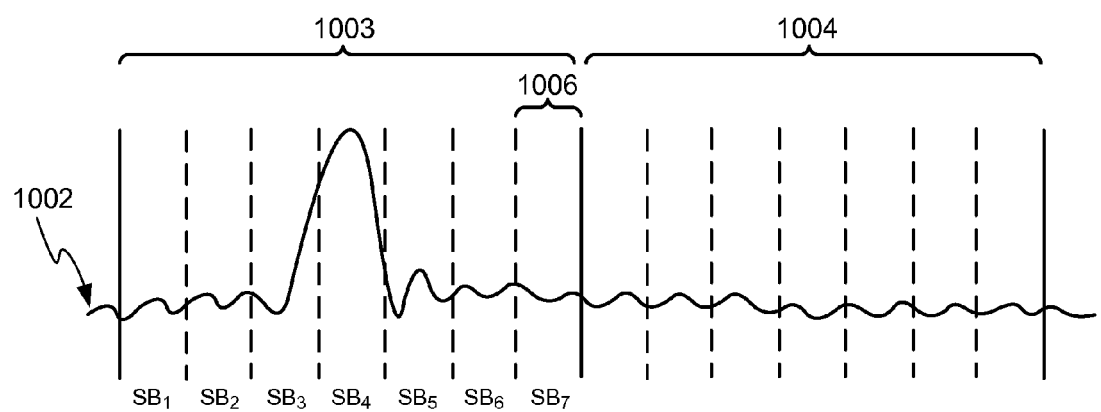
FIG. 10 shows a simple graphical representation of the received power of a received signal across two bands.

Referring to the simple graphical representation of the received power 1002 of a received signal across two bands 1003, 1004 as shown in FIG. 10 and where sub-bands 1006 are indicated by dotted lines, it can be seen that there is an interferer in one band 1003 and no interferer in the other band 1004. Consequently using the interference detection and mitigation methods described herein, the noise variance estimates for sub-carriers in the first band 1003 will be adjusted (in blocks 904 and 906) and the noise variance estimates for sub-carriers in the second band 1004 will not be adjusted (in block 910, as there is no interferer within the band). If an interferer is detected in only sub-band $SB_4$ within the first band 1003, then the noise variance estimates for data sub-carriers within sub-bands $SB_1$-$SB_3$ and $SB_5$-$SB_7$ will be adjusted downwards (these sub-carriers are considered neighbouring non-interfered sub-carriers) and the noise variance estimates for data sub-carriers within sub-band $SB_4$ will be increased. Consequently, if the method is implemented to include block 902, this method step will identify those sub-carriers in sub-band $SB_4$ as belonging to the first set of sub-carriers and those sub-carriers in sub-bands $SB_1$-$SB_3$ and $SB_5$-$SB_7$ as belonging to the second set of sub-carriers.

In an example implementation, the modification of the noise variance estimates (in blocks 904 and 906) for data sub-carriers in bands in which an interferer is detected (in block 610), may be performed as follows:

For interfered sub-carriers (i.e. those in the first set described above), the adjusted noise variance estimate is given by the original noise variance estimate (as generated by interpolation in block 212) multiplied by the power ratio in the interfered sub-band.

For non-interfered sub-carriers in the interfered band (i.e. those in the second set described above), the adjusted noise variance estimate is given by the original noise variance estimate divided by the power ratio in the interfered sub-band.

As described above (with reference to FIG. 6), the power ratio in the interfered sub-band is the ratio of the sub-band symbol power in the interfered sub-band (e.g. in sub-band $SB_4$ in the example shown in FIG. 10) to the mean sub-band symbol power over the entire band (e.g. over $SB_1$-$SB_7$ in band 1003 in the example shown in FIG. 10), e.g.

$$R_x^y = \frac{P_x^y}{P_{av}^y}$$

where y identifies band 1003 in this example. This same parameter (the power ratio) is used to both increase some noise variances and decrease others.

Where there are two interferers in a sub-band, the power ratio will be different in both sub-bands. In such an instance, the adjustment ratios are derived independently for the two sub-bands based on their sub-band power divided by the mean, whereas the adjustment ratio for the non-interfered sub-bands is the sum of the powers of the interfered sub-bands divided by the mean sub-band power. This may be extended further to situations where there are more than two interferers in a sub-band.

In the method shown in FIG. 9 and described above, all the data sub-carriers within a sub-band are treated in the same way and their noise variance estimates are adjusted if they are located in a band in which an interferer has been detected. To provide finer granularity of interference mitigation, narrower sub-bands may be used (e.g. a larger value of s for the same value of n); however as described above, if there are only a small number of sub-carriers per sub-band, it may be necessary to average the sub-band power over time (in block 607) which reduces the speed of the method. As the interference detection is performed using data from all sub-carriers and not just pilots, interference can be detected even where it does not fall on a pilot and then using the methods described above, the effect of this interference on the noise variance estimates for data sub-carriers can be mitigated. In addition, the use of the whole symbol enables the method to respond quickly to time-varying SNR.

The method of generating noise variance estimates described above (and shown in FIGS. 2, 4 and 9) has a fast convergence time, while the combination of this method with the interference detection method described above (and shown in FIGS. 6 and 9) additionally enables the normalization of the noise variance estimate in interfered sub-carriers. Furthermore, as described above, the noise variance per band is stored instead of saving the noise variance per pilot and this leads to significant savings in memory.

Figure 11:
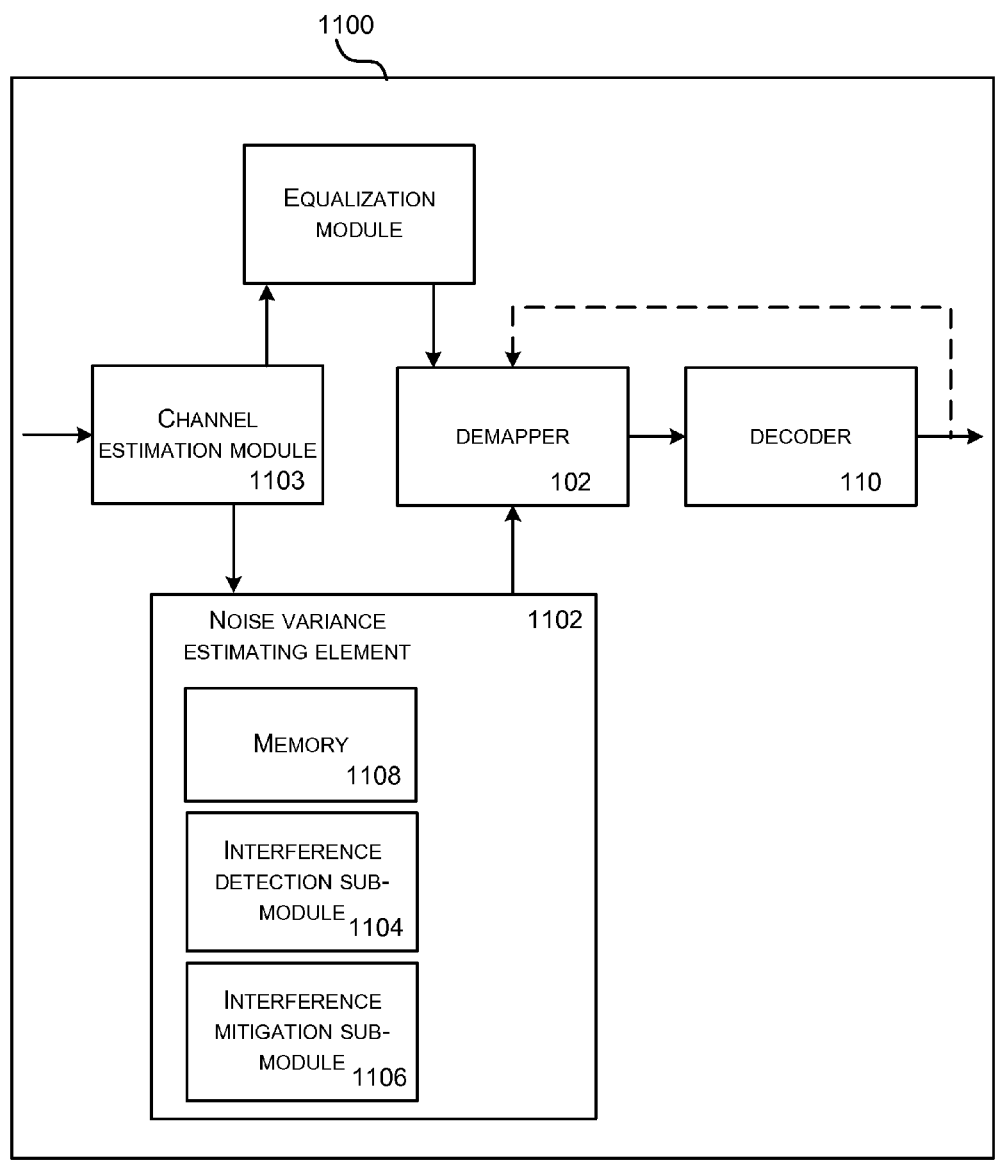
FIG. 11 is a schematic diagram of an OFDM receiver including a noise variance estimating element arranged to perform aspects of the methods described herein.

The methods described above may be implemented within an OFDM receiver (such as a DTT or DVB-T2 receiver) and in particular within a noise variance estimating element 1102 within the receiver 1100 as shown in FIG. 11. This noise variance estimating element 1102 takes input from a channel estimation module 1103 and provides an output (the noise variance estimates) to the demapper 102. As described above, the method of noise variance estimation (as shown in FIG. 2) may be implemented independently of the other methods described herein, or alternatively, the method may be combined with other methods described herein (e.g. with the method of interference detection as described above with reference to FIG. 6). Where the methods of noise variance estimation and interference detection and mitigation are used (as shown in FIG. 9), the noise variance estimating element 1102 may comprise interference detection and interference mitigation sub-modules 1104, 1106.

The noise variance estimating element 1102 and any sub-modules 1104, 1106 may be implemented in hardware and/or software and the noise variance estimating element 1102 may form part of a single chip receiver. For example, the noise variance estimating element 1102 may comprise a number of logic elements (e.g. estimating logic, dividing logic and calculating logic) which may implement different steps of the methods described above and these different logic elements may be implemented in software or in hardware logic.

In an example, the noise variance estimating element 1102 comprises one or more processors which may be microprocessors, controllers or any other suitable type of processors for processing computer executable instructions to control the operation of the device in order to perform some or all of the steps of the methods described herein. In some examples, for example where a system on a chip architecture is used, the processors may include one or more fixed function blocks (also referred to as accelerators) which implement a part of the method of noise variance estimation, interference detection and/or interference mitigation in hardware (rather than software or firmware).

The computer executable instructions (which when executed cause the processor to implement one or more steps from the methods described herein) may be provided using any computer-readable media that is accessible by the processor. Computer-readable media may include, for example, computer storage media such as memory 1108 and communications media. Computer storage media, such as memory 1108, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. It will be appreciated that the computer storage media (or memory 1108) may be within the receiver 1100 or alternatively the storage may be distributed or located remotely and accessed via a network or other communication link (e.g. using a communication interface).

The memory 1108 described above which stores the computer executable instructions, or another memory element, is used to store the noise variance estimates for each band, as described above with reference to block 208.

It will be appreciated that FIG. 11 only shows a subset of the elements within an OFDM receiver and the receiver may comprise many other elements. It will also be appreciated that the elements in FIG. 11 are functional elements and in different implementations, some of the functional elements may be combined together within a physical device.

The methods described above may be implemented in a DVB receiver and in which case the pilots referred to above may be scattered pilots.

The term 'processor' and 'computer' are used herein to refer to any device with processing capability such that it can execute instructions. Those skilled in the art will realize that such processing capabilities are incorporated into many different devices and therefore the term 'computer' includes set top boxes, media players, digital radios, PCs, servers, mobile telephones, personal digital assistants and many other devices.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term 'comprising' is used herein to mean including the method blocks or elements identified, but that such blocks or elements do not comprise an exclusive list and an apparatus may contain additional blocks or elements and a method may contain additional operations or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A method of estimating noise variance within an orthogonal frequency division multiplexing (OFDM) receiver, the method comprising:
   evaluating, by estimating logic associated with said receiver, a noise estimate for each of a plurality of pilots within one or more received OFDM symbols;
   dividing, by dividing logic associated with said receiver, the plurality of pilots into bands;
   calculating, by calculating logic associated with said receiver, a noise variance estimate for each band by averaging noise estimates for pilots within the band;
   storing the noise variance estimate for each band in memory;
   setting, by an interpolation engine associated with said receiver, a noise variance estimate for a pilot equal to the calculated noise variance estimate for the band which includes the pilot; and
   determining, by said interpolation engine, a noise variance estimate for a data sub-carrier within the one or more received OFDM symbols by interpolating between the noise variance estimates for each pilot; wherein
   the determined noise variance estimate is used by said OFDM receiver in decoding at least one received OFDM symbol.

2. The method according to claim 1, wherein calculating a noise variance estimate for each band comprises averaging noise estimates for pilots within the band from a single received OFDM symbol.

3. The method according to claim 1, wherein calculating a noise variance estimate for each band comprises averaging the stored noise estimates for pilots within the band from a plurality of received OFDM symbols.

4. The method according to claim 1, wherein calculating the noise variance estimate for each band further comprises using time-averaging, such that a newly calculated noise variance estimate is combined with a previously stored noise variance estimate for the band.

5. The method according to claim 1, wherein dividing the plurality of pilots into bands comprises dividing a received OFDM symbol into the bands and the method further comprising:
   dividing each band into a plurality of sub-bands;
   calculating the sub-band power for each sub-band, the sub-band power comprising the average power of all sub-carriers within the sub-band;
   calculating a mean sub-band power within each band; and
   for each band, determining if there is interference in a sub-band within the band, by comparing the sub-band power and the mean sub-band power within the band.

6. The method according to claim 5, wherein comparing the sub-band power and the mean subband power within the band comprises:
   calculating a ratio of the sub-band power to the mean sub-band power within the band and comparing this ratio to a threshold value.

7. The method according to claim 6, wherein interference is detected in a sub-band if the ratio exceeds the threshold value and interference is not detected if the ratio does not exceed the threshold value.

8. The method according to claim 6, wherein the threshold value is calculated for each band.

9. The method according to claim 8, wherein the threshold value for a band is defined based on the mean value of the ratio across the band and the minimum value of the ratio across the band.

10. The method according to claim 5, further comprising:
    averaging the sub-band power for one or more sub-bands over a period of time prior to calculating the mean sub-band power within each band.

11. The method according to claim 5, further comprising:
    on determining that there is interference in a sub-band within a band, increasing the noise variance estimate for sub-carriers within the sub-band; and
    decreasing the noise variance estimate for sub-carriers in other sub-bands within the same band.

12. The method according to claim 11, wherein increasing the noise variance estimate for subcarriers within the sub-band comprises:
    multiplying the noise variance estimate for a sub-carrier by the sub-band power for the subband in which there is interference and dividing by the mean sub-band power for the band in which the sub-band is located.

13. The method according to claim 11, wherein decreasing the noise variance estimate for subcarriers in other sub-bands within the same band comprises:
    dividing the noise variance estimate for a sub-carrier by the sum of the sub-band power for the sub-bands in which there is interference and multiplying by the mean sub-band power for the band in which the sub-band is located.

14. The method according to claim 11, wherein sub-carriers comprise pilots.

15. A noise variance estimating element for an orthogonal frequency division multiplexing (OFDM) receiver, the noise variance estimating element comprising:
    estimating logic arranged to evaluate a noise estimate for each of a plurality of pilots within one or more received OFDM symbols;
    dividing logic arranged to divide the plurality of pilots into bands;
    calculating logic arranged to calculate a noise variance estimate for each band by averaging noise estimates for pilots within the band;
    memory arranged to store the noise variance estimate for each band in memory; and
    an interpolation engine arranged to set a noise variance estimate for a pilot equal to the calculated noise variance estimate for the band which includes the pilot and to determine a noise variance estimate for a data sub-carrier within the one or more received OFDM symbols by interpolating between the noise variance estimates for each pilot; wherein
    the determined noise variance estimate is used by said OFDM receiver in decoding at least one received OFDM symbol.

16. The noise variance estimating element according to claim 15, wherein the calculating logic is arranged to use an on-line algorithm and wherein the memory is further arranged to store a running noise variance estimate.

17. A non-transitory computer readable storage medium having encoded thereon computer readable program code for generating a manifestation of the noise variance estimating element of claim 15.

18. A method of detecting interference comprising:
dividing by dividing logic associated with an orthogonal frequency division multiplexing (OFDM) receiver, a received OFDM symbol into one or more bands;
dividing, by said dividing logic, each band into a plurality of sub-bands;
calculating, by calculating logic associated with said receiver, the sub-band power for each sub-band, the sub-band power comprising the average power of all the sub-carriers within the sub-band;
calculating, by said calculating logic, a mean sub-band power within each band;
for each band, determining, by logic associated with said receiver, if there is interference in a sub-band within the band, by comparing the sub-band power and the mean sub-band power within the band;
on determining that there is interference in a sub-band within a band, increasing the noise variance estimate for sub-carriers within the sub-band; and
decreasing the noise variance estimate for data sub-carriers in other sub-bands within the same band; wherein
the determined noise variance estimate is used by said OFDM receiver in decoding at least one received OFDM symbol.

19. A non-transitory computer readable storage medium having encoded thereon computer readable program code for generating a processor configured to perform the method of claim 1.

* * * * *